United States Patent
Hsu et al.

(10) Patent No.: US 6,703,700 B2
(45) Date of Patent: Mar. 9, 2004

(54) SEMICONDUCTOR PACKAGING STRUCTURE

(76) Inventors: Cheng-Ho Hsu, No. 238, Lane 301, Kai-Feng Rd., Hsin-Hsing Dist., Kaohsiung (TW); Yi-Hua Chang, 6F, No. 10-1, Lane 578, Chung-Lun-Erh Rd., Feng-Shan City, Kaohsiung Hsien (TW); Jen-Cheng Liou, No. 59-1, Lane 190, Nan-Tzu-Hsin Rd., Kaohsiung (TW)

( * ) Notice: Subject to any disclaimer, the term of this patent is extended or adjusted under 35 U.S.C. 154(b) by 147 days.

(21) Appl. No.: 09/975,833

(22) Filed: Oct. 12, 2001

(65) Prior Publication Data

US 2003/0071332 A1 Apr. 17, 2003

(51) Int. Cl.⁷ .............................................. H01L 23/02
(52) U.S. Cl. ...................................................... 257/680
(58) Field of Search ................................. 257/666, 672, 257/676, 678, 680, 690, 692, 700–725, 787, 793, 794, E23.031, E23.052, E23.042; 438/106, 111, 123

(56) References Cited

U.S. PATENT DOCUMENTS

| | | | | | |
|---|---|---|---|---|---|
| 3,768,986 A | * | 10/1973 | Ramos et al. | ............... | 428/577 |
| 4,303,934 A | * | 12/1981 | Stitt | ........................... | 257/753 |
| 5,200,367 A | * | 4/1993 | Ko | ............................... | 29/827 |
| 5,343,076 A | * | 8/1994 | Katayama et al. | .......... | 257/717 |
| 5,382,546 A | * | 1/1995 | Yamada et al. | ............... | 29/827 |
| 6,384,472 B1 | * | 5/2002 | Huang | ......................... | 257/680 |
| 6,476,469 B2 | * | 11/2002 | Hung et al. | ................. | 257/676 |
| 2002/0089025 A1 | * | 7/2002 | Chou | .......................... | 257/433 |

* cited by examiner

*Primary Examiner*—W. David Coleman
*Assistant Examiner*—Brook Kebede
(74) *Attorney, Agent, or Firm*—Tom Sisson; Jackson Walker LLP

(57) ABSTRACT

A semiconductor packaging structure mainly has a lead frame with a die pad and a plurality of leads, a wall portion formed by molding compound positioned around a periphery of the lead frame, a chip mounted on the die pad and electrically connected with the plurality of lead via gold wires, and a cover mounted on the wall portion to enclose the chip. An interval is defined between the die pad and the plurality of leads for filling with an isolating resin, the interval further communicates with multiple gaps and each gap is defined between two adjacent of the plurality of leads, wherein each gap is also filled with the isolating resin.

9 Claims, 8 Drawing Sheets

SEMICONDUCTOR PACKAGING STRUCTURE

BACKGROUND OF THE INVENTION

1. Field of the Invention

The present invention relates to a semiconductor packaging structure, and more particularly to an improved semiconductor packaging structure that is easy to fabricate, incurs a low production cost and has a good heat dissipation.

2. Description of Related Art

With reference to FIG. 13 a conventional semiconductor packaging structure for sensing optical signals, such as a charge coupled device (CCD) or a photoelectric element, has a substrate (50) defined with a groove (51) in the middle portion of the substrate (50), wherein a chip (52) is mounted on the substrate (50). The substrate (50) further has multiple traces (not shown) arranged thereon, and the chip (52) is electrically connected to the multiple traces via multiple gold wires (53). Then a transparent cover (54) covers the groove (51) for protecting the chip (52).

In general, the substrate (50) used in foregoing semiconductor packaging is formed of ceramic material. The advantage of the ceramic material is that the ceramic material would not absorb the moisture in the air, so that the chip (52) enclosed in the substrate (50) would not be affected by the moisture, and is able to work stably. However, ceramic material is expensive and difficult to process. Therefore, another conventional semiconductor packaging structure is disclosed.

With reference to FIG. 14, the packaging structure is substantially the same as that shown in FIG. 13, wherein the packaging structure shown in FIG. 14 comprises a substrate (60) made of epoxy resin, such as BT, a wall portion (61) installed on the periphery of the substrate to define a groove (62) for receiving a chip (63) mounted on the substrate (60), and a plurality of leads (64) arranged on a top surface of the substrate (60) and extending to pass through a lateral side of the substrate (60) to a bottom surface of the substrate (60). The chip (60) is further electrically connected to the plurality of leads (64) via multiple gold wires (65). A transparent cover (66) covers the groove (62) to enclose the chip (63). Although such a semiconductor packaging structure is easy to process and is able to reduce the production cost, the packaging structure still has some shortcomings as listed below.

1. Since the substrate is made of an epoxy resin, the substrate is easy to absorb moisture, and the chip mounted on the substrate would be affected by the moisture, so that the stability of the chip is reduced.
2. The plurality of leads on the substrate is formed by an electroplating process, such that the reliability of forming the leads is hard to control.
3. The efficiency of heat dissipation of the epoxy resin substrate is much lower than a substrate made of metal.
4. Since the plurality of leads on the substrate extends from the top surface of the substrate and passes through a lateral side of the substrate to a bottom surface of the substrate, thus the signal conducting path is very long, and the long path may delay the signal conducting.

To overcome the shortcomings, the present invention tends to provide a semiconductor packaging structure so as to mitigate and obviate the aforementioned problems.

SUMMARY OF THE INVENTION

The primary objective of the invention is to provide a semiconductor packaging structure that is easy to fabricate, is able to reduce the production cost, has a high efficiency of heat dissipation and is able to mitigate a signal delay.

Other objects, advantages and novel features of the invention will become more apparent from the following detailed description when taken in conjunction with the accompanying drawings.

DETAILED DESCRIPTION OF THE PREFERRED EMBODIMENT

Figure 1:
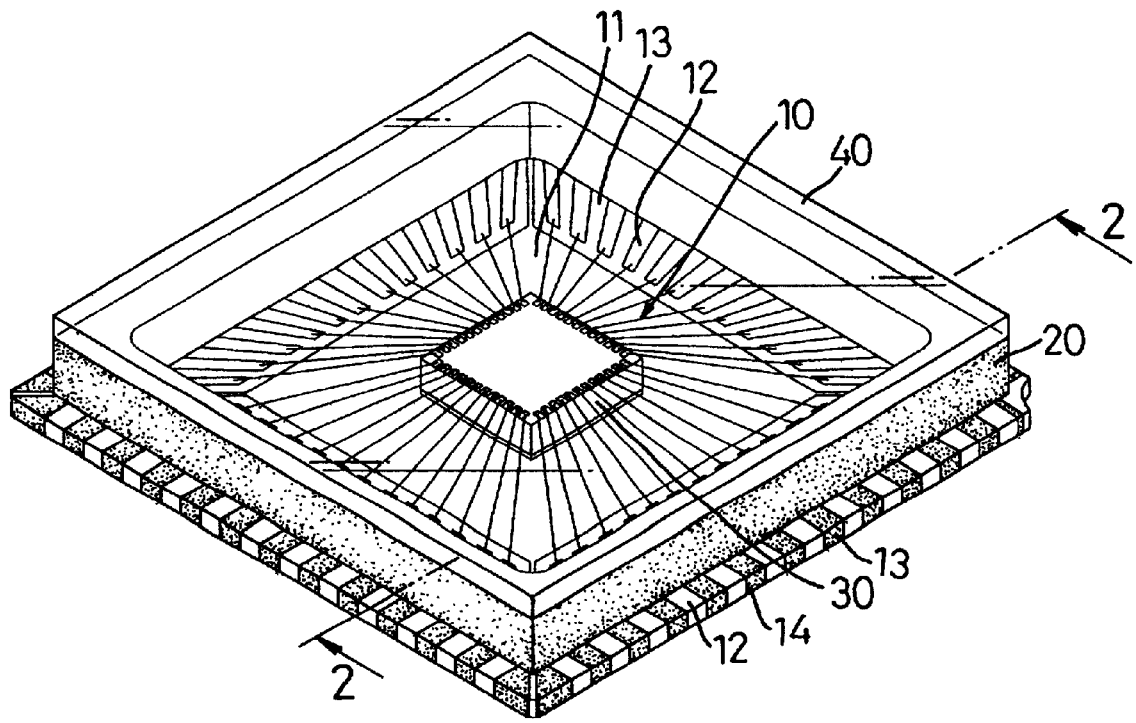
FIG. 1 is a perspective view of a semiconductor packaging structure in accordance with the present invention.
Figure 2:
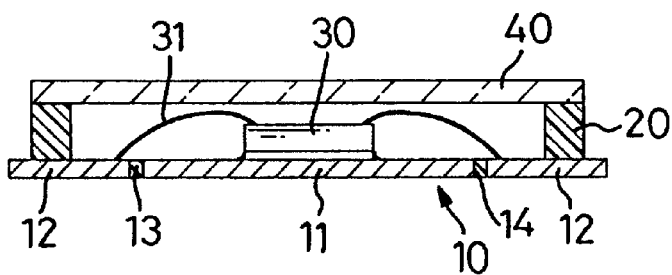
FIG. 2 is a cross-sectional view of a first embodiment of a semiconductor packaging structure in accordance with the present invention.

With reference to FIGS. 1 and 2, a first embodiment of a semiconductor packaging structure comprises a lead frame (10) made of a metal material, a wall portion (20), a chip (30) and a transparent cover (40).

Figure 3:
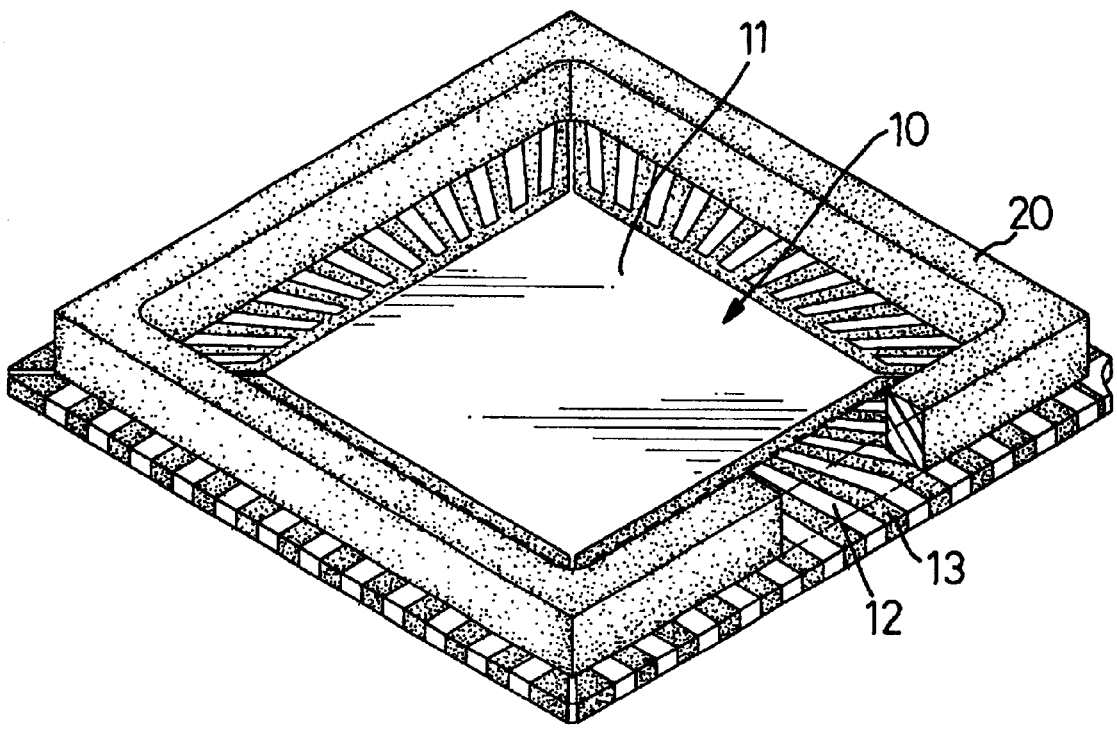
FIG. 3 is a perspective view of the semiconductor packaging structure of FIG. 1, wherein a transparent cover is not yet installed on the semiconductor packaging structure.

The lead frame (10) has a die pad (11) for mounting the chip (30) and a plurality of leads (12) arranged around the die pad (11), wherein each lead (12) is separate from each other. Multiple gaps (14) each defined between two adjacent leads (12), and an interval between the die pad (11) and the plurality of leads (12), are all filled with an isolating resin (13) (as shown in FIG. 3).

The wall portion (20) is formed by molding compound and is installed at periphery of the lead frame (10), wherein the wall portion (20) is also formed by an isolating material. Both the wall portion (20) and the isolating resin (13) can be formed integrally on the lead frame (10) by molding compound, or the wall portion (20) is formed on the lead frame (10) after the isolating resin (13) is put in the gaps (14). When forming the wall portion (20) on the lead frame (10), an outer flange of the wall portion (20) can be formed in alignment with an outer flange of the lead frame (10) (not shown in Figures), or the outer flange of the wall portion (20) can be formed behind the outer flange of the lead frame (10) (as shown in FIG. 3).

The chip (30) is mounted on the die pad (11) by a silver epoxy or other kinds of solders and is further electrically connected to the plurality of leads (12) via gold wires (31).

An enclosing means, such as the transparent cover (40), a pervious resin or a metal cover, is applied on the packaging structure to enclose the chip (30) inside the wall portion (20). In this embodiment, the transparent cover (40) is arranged on the wall portion (20) to enclose the chip (30) inside the wall portion, so that the transparent cover (40) is able to protect the chip (20) from the contaminant, such as dust or moisture. Thereby, the packaging structure of the present invention is complete.

Moreover, the transparent cover (40) is able to be replaced with a transparent resin. Such a pervious resin is put inside the wall portion (20) to form a complete packaging structure. Both the transparent cover (40) and the transparent resinare suitable for the optical sensing semiconductor packaging structure. The packaging structure of the present invention is also suitable for communication semiconductor elements (such as a Surface Audio Wave Filter, SAW Filter), if the transparent cover (40) is replaced with a metal cover. The metal cover can provide a protection to the communication semiconductor element packaged inside, so that the semiconductor element would not be affected by electromagnetic interference (EMI).

Figure 4:
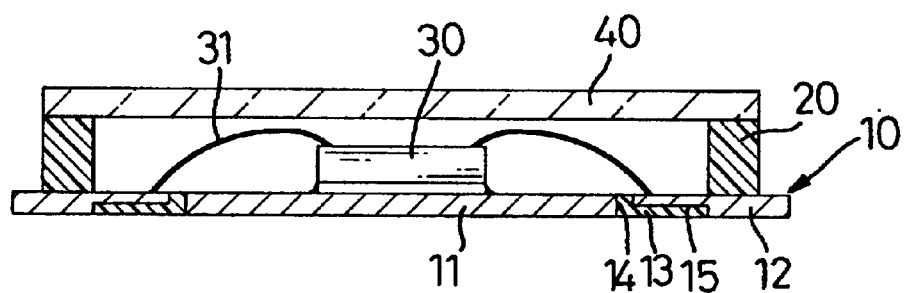
FIG. 4 is a cross-sectional view of a second embodiment of a semiconductor packaging structure in accordance with the present invention.

With reference to FIG. 4, a second embodiment of the present invention is shown. The second embodiment is substantially the same as the first embodiment shown in FIG. 2. The only change is in the lead frame (10). The lead frame (10) of the second embodiment further has multiple notches (15) which each is defined on a bottom surface of the lead frame (10) and communicate with one of the multiple gaps (14), wherein each notch (15) is formed by etching. An extending direction of the notch (15) is toward to the outer flange of the lead frame (10) (as shown in FIG. 4), or the direction is bi-directional (the third embodiment), toward to the outer flange of the lead frame (10) and the die pad (11) (as shown in FIG. 5).

Figure 5:
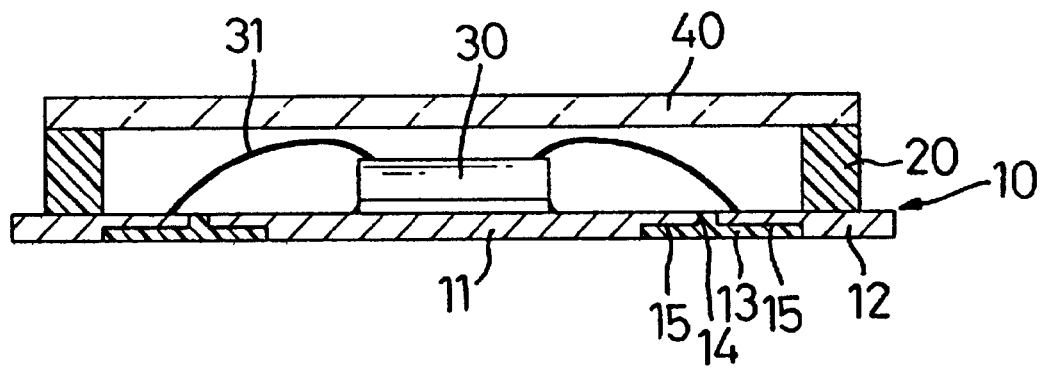
FIG. 5 is a cross-sectional view of a third embodiment of a semiconductor packaging structure in accordance with the present invention.

With reference to FIGS. 4 and 5, a thickness of a lateral side that defines the notch (15) is smaller than a thickness of the lead frame (10), and the thickness of the lateral side is only a half the thickness of the lead frame (10). Each notch (15) is also filled with the isolating resin (13), wherein since the gap (14) is communicated with the notch (15) and both are filled with the isolating resin (13), the area that the isolating resin (13) contacts with the lead frame (10) is increased, whereby the engagement force between the lead frame (10) and the isolating resin (13) is enhanced.

Figure 6:
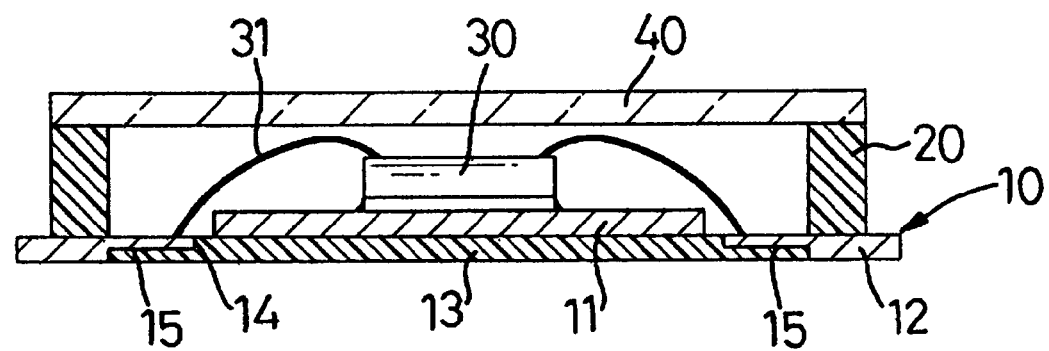
FIG. 6 is a cross-sectional view of a fourth embodiment of a semiconductor packaging structure in accordance with the present invention.

With reference to FIG. 6, the fourth embodiment of the invention is shown. The die pad (11) and the leads (12) in this embodiment are not in the same horizontal plane. The die pad (11) is higher than the leads (12), whereby a space is defined below the die pad (11) to receive the isolating resin (13). When the isolating resin (13) is put in the space, the area that the isolating resin (13) contacts with the lead frame (10) is greatly increased thereby the engagement force between the lead frame (10) and the isolating resin (13) is also enhanced.

Figure 7:
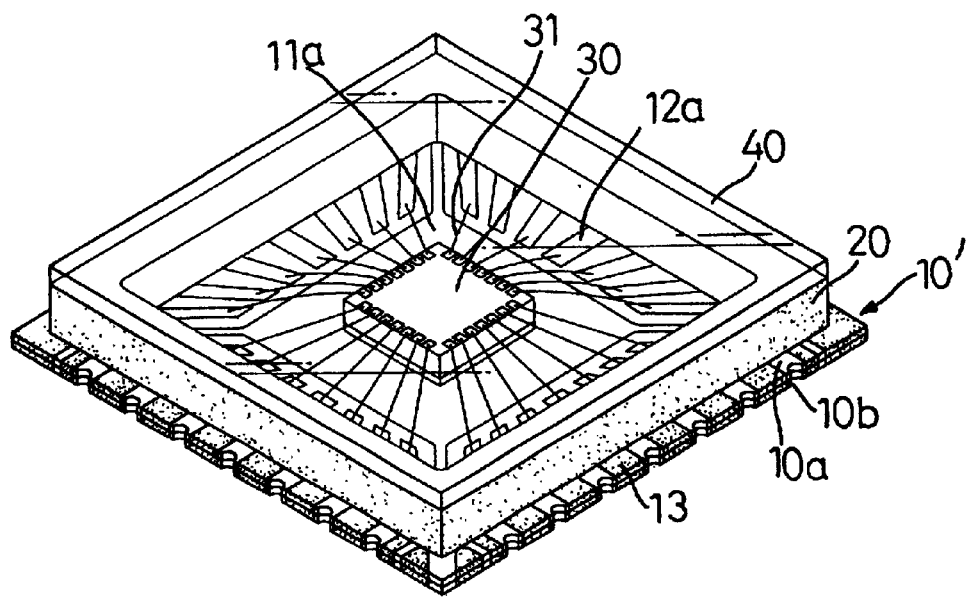
FIG. 7 is perspective view of a fifth embodiment of a semiconductor packaging structure in accordance with the present invention.
Figure 8:
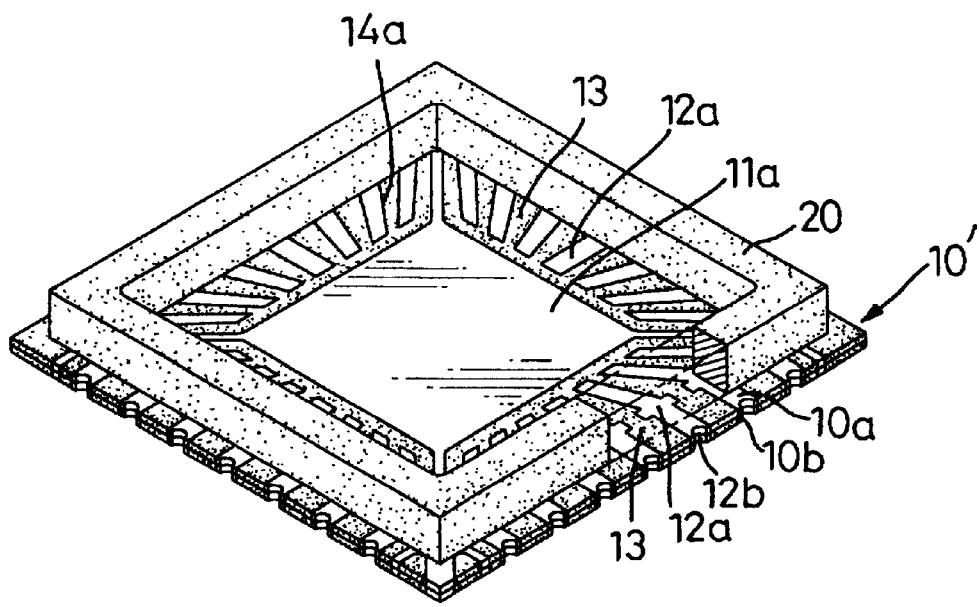
FIG. 8 is a perspective view of the semiconductor packaging structure of FIG. 7, wherein a transparent cover is not yet installed on the semiconductor packaging structure.

With reference to FIGS. 7 and 8, the fifth embodiment is shown. In this embodiment, the lead frame (10) shown described foregoing is replaced with a metal frame (10'), wherein the metal frame (10') is combined by an upper lead frame (10a) and a lower lead frame (10b) through a thermal-compress process. Before the thermal-compress process, the surfaces of the both the frames (10a)(10b) can be electroplated with a metal film thereon to improve the combination force.

Figure 9:
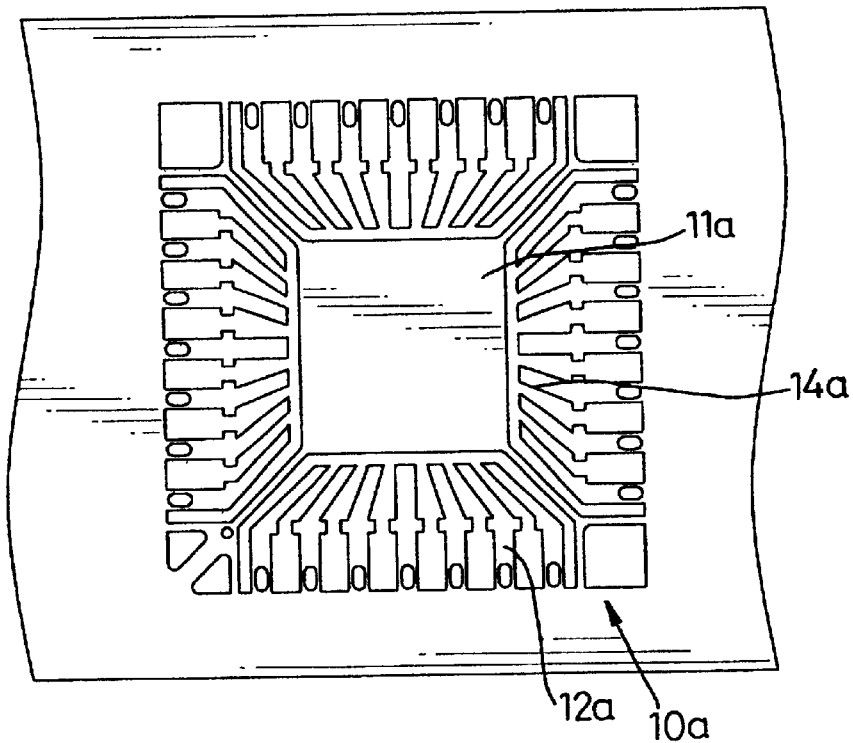
FIG. 9 is a plan view of a top lead frame in accordance with the present invention.
Figure 10:
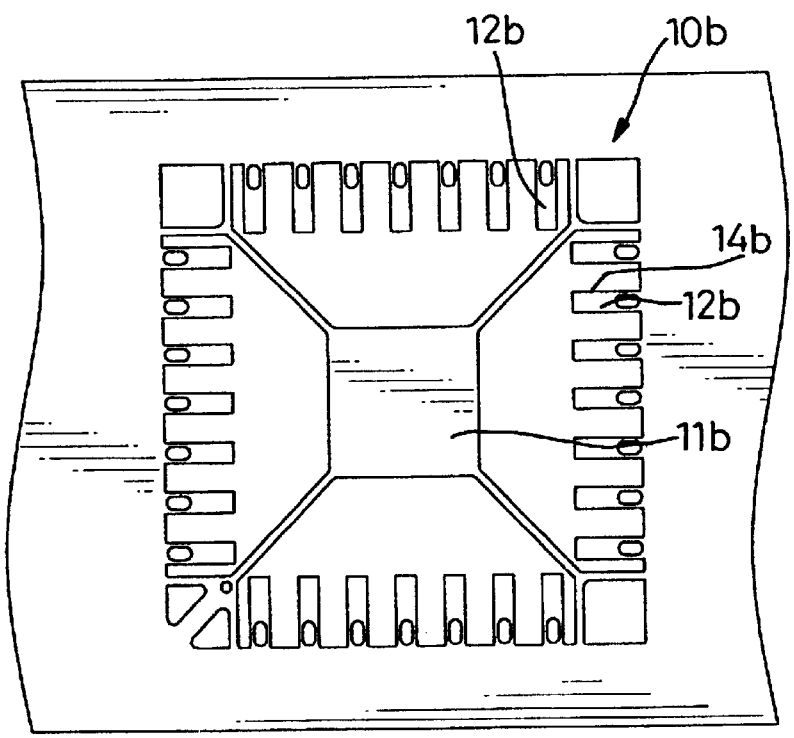
FIG. 10 is a plan view of a bottom lead frame in accordance with the present invention.

With reference to FIGS. 9 and 10, both the upper lead frame (10a) and the lower lead frame (10b) have a die pad (11a)(11b) and a plurality of leads (12a)(12b) arranged around the die pad (11a)(11b). A chip (30) is mounted on the die pad (11a) of the upper lead frame (10a) and electrically connected to the plurality of leads (12a) via gold wires (31).

The die pad (11a) of the upper lead frame (10a) is slightly bigger than that of the lower lead frame (10b). The plurality of leads (12a) (12b) of the upper lead frame (10a) and the lower lead frame (10b) have the different shapes, wherein each of the plurality of leads (12a) of the upper lead frame (10a) has an external portion extending toward the flange of the upper lead frame (10a) and an internal portion extending toward the die pad (11a). However, each of the plurality of leads (12b) of the lower lead frame (10b) only has an external portion corresponding to one of the external portions of the leads (12a). An interval is defined between the die pad (11a)(11b) and the plurality of leads (12a)(12b) for filling with the isolating resin (13). Multiple gaps (14a)(14b) are each defined by two adjacent leads (12a)(12b), wherein the multiple gaps (14a)(14b) are communicated with each other.

Figure 11:
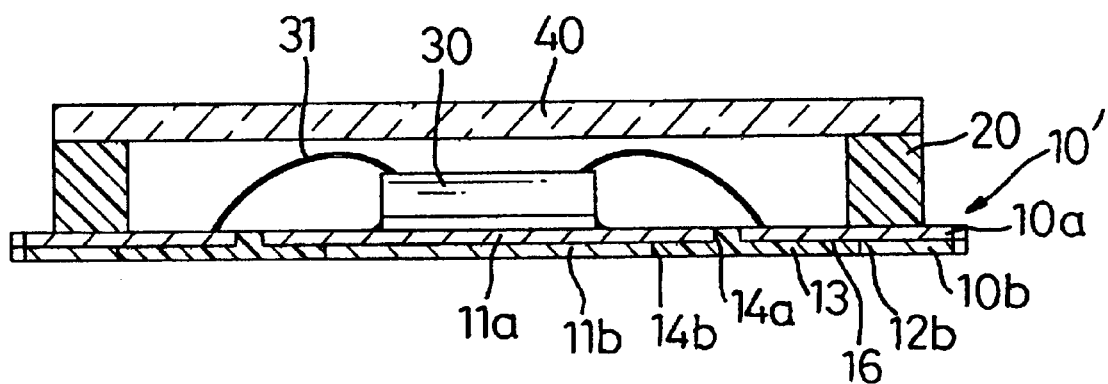
FIG. 11 is a cross-sectional view of the fifth embodiment of the semiconductor packaging structure of the present invention.

With reference to FIG. 11, when the upper lead frame (10a) and the lower lead frame (10b) are in alignment with each other and compressed together to form the metal frame (10'), and the leads (12b) of the lower lead frame (10b) are corresponded to the leads (12a) of the upper lead frame (10a). Since the two die pads (11a)(11b) and the leads (12a)(12b) of the upper lead frame (10a) and the lower lead frame (10b) have the different size, once the two lead frames (10a)(10b) are compressed together, multiple interstice (16) are defined for receiving the isolating resin (13). The isolating resin (13) further fills the multiple interstice (16) and the gaps (14a)(14b) by molding compound.

Figure 12:
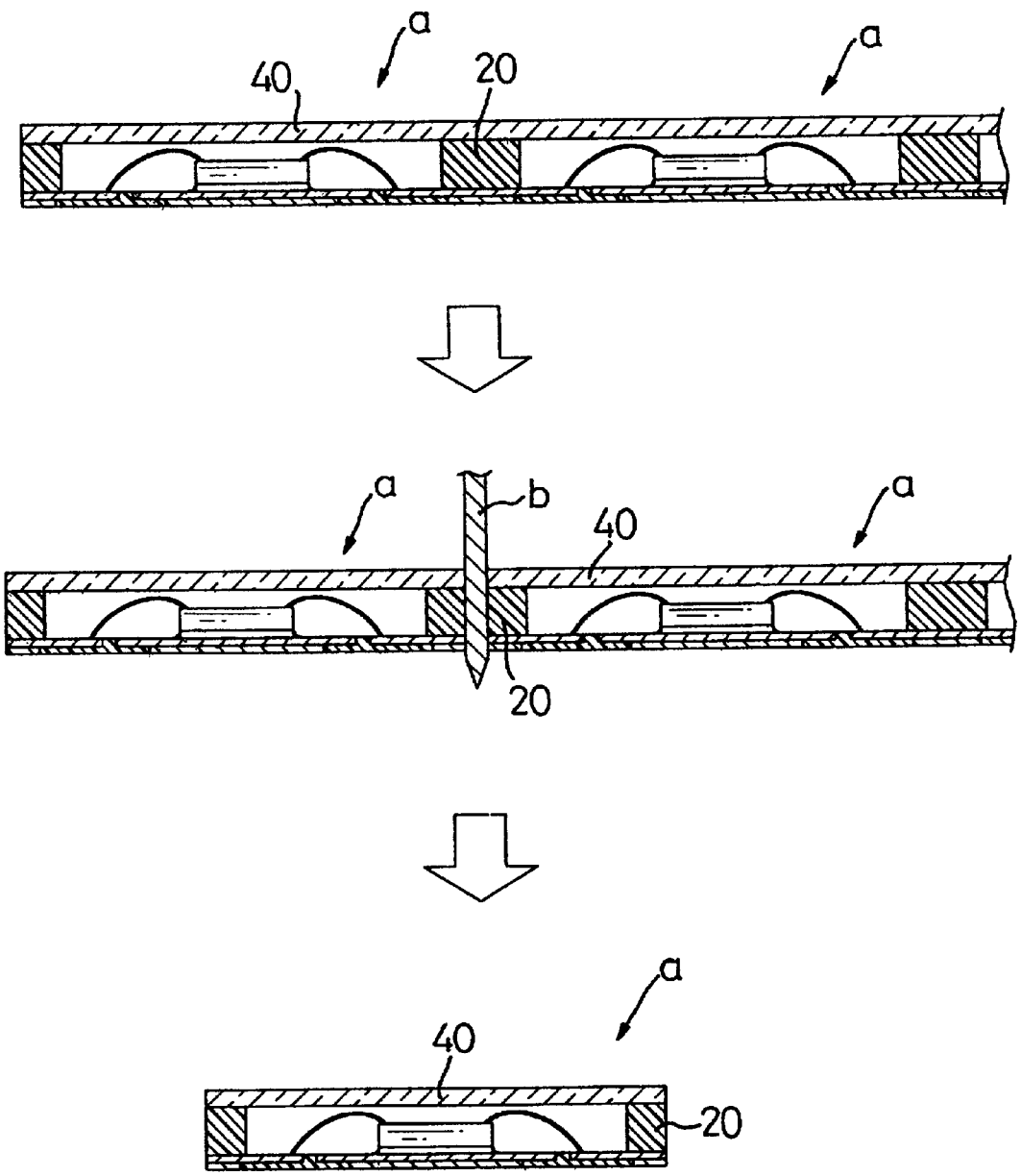
FIG. 12 is sequential view shows to isolate multiple semiconductor packaging structures of the present invention.
Figure 14:
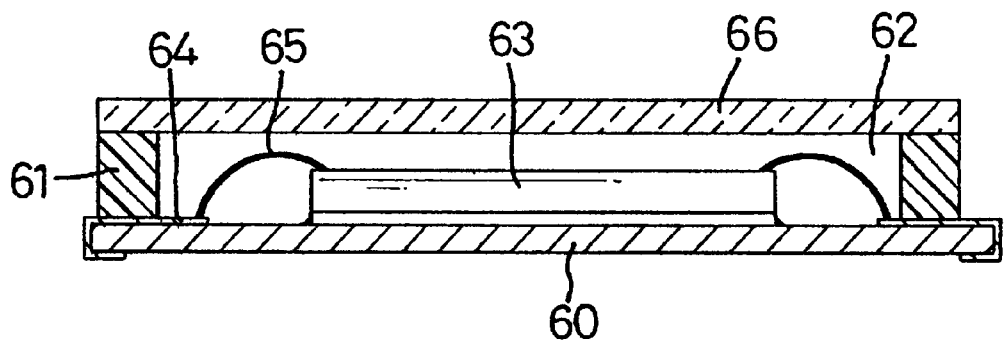
FIG. 14 is a cross-sectional view of another conventional semiconductor packaging structure.
Figure 13:
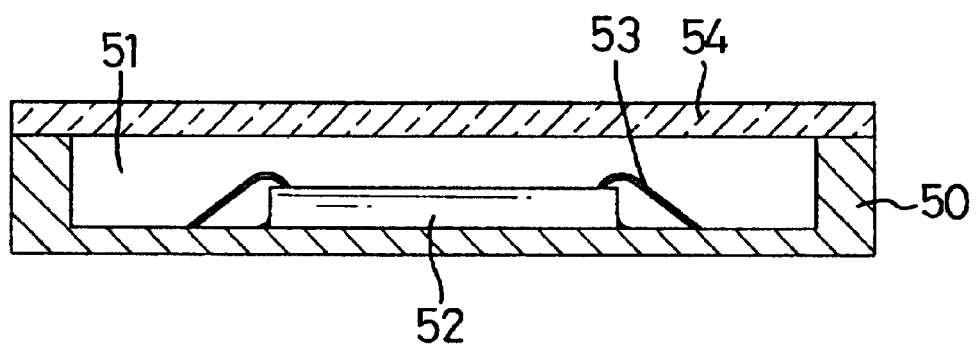
FIG. 13 is a cross-sectional view of a conventional semiconductor packaging structure.

If the present invention is applied to a semiconductor packaging structure that occupies a big volume, such as an optical element, the present invention can be fabricated to form an independent packaging structure. Otherwise, with reference to FIG. 12, if the present invention is applied to a packaging structure with a small volume, such as a communication element, firstly the present invention can be fabricated to form multiple packaging structures (a) simultaneously, and then once the transparent covers (40) are fitted on the wall portions (20), a cutter (b) is further used for isolating the multiple packaging structures (a) to form an individual one, so that the production efficiency is able to be increased.

From the foregoing description, the present invention has the following advantages:

1. The present invention uses a lead frame to replace a substrate, the lead frame can be formed by a stamping process or an etching process, whether the stamping or the etching processes are very easy to manufacture and only incur a low production cost.
2. Since the lead frame is made of metal, it would not absorb moisture and thus the chip mounted on the lead frame would not be affected by the moisture and has a good reliability.

3. Since the bottom of the die pad where the chip mounted thereon is exposed to the air, the heat generating by the chip is directly conducted to the die pad and then the heat is able to dissipate to the air through the die pad. Therefore the present invention has a better heat dissipation efficiency than the conventional epoxy resin substrate.

4. Since the chip is directly connected to the leads of the lead frame and the leads are electrically and directly mounted on a circuit board, thus the signal conduction path is very short and the conducting delay is avoid.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A semiconductor packaging structure comprising:

metal lead frame composed of an upper lead frame and a lower lead frame, wherein the upper lead frame has a first die pad, a first plurality of leads arranged around the first die pad, a first interval defined between the first die pad and the first plurality of leads, and a first plurality of gaps each is defined by an adjacent two of the first plurality of leads and is communicated with the first interval;

the lower lead frame has a second die pad, a second plurality of leads arranged around the second die pad, a second interval defined between the second die pad and the second plurality of leads, and a second plurality of gaps, each of the second plurality of gaps is defined by an adjacent two of the second plurality of leads and is communicated with the second interval, wherein when the upper lead frame and the lower lead frame are compressed together, the first interval, the second interval, the first and the second plurality of gaps are communicated with each other for receiving an isolating resin;

a wall portion formed around a periphery of the upper lead frame;

a chip mounted on the first die pad of the upper lead frame and electrically connected to the first plurality of leads; and a cover mounted on the wall portion to enclose the chip inside the wall portion.

2. The semiconductor packaging structure as claimed in claim 1, wherein the size of the second die pad is slightly smaller than that of the first die pad.

3. The semiconductor packaging structure as claimed in claim 1, wherein each of the first plurality of leads has an external portion extending toward a flange of the upper lead frame, and has an internal portion extending toward the first die pad, each of the second plurality of leads corresponds to the external portion of one of the first plurality of leads.

4. The semiconductor packaging structure as claimed in claim 2, wherein each of the first plurality of leads has an external portion extending toward a flange of the upper lead frame, and has an internal portion extending toward the first die pad, each of the second plurality of leads corresponds to the external portion of one of the first plurality of leads.

5. The semiconductor packaging structure as claimed in claim 1, wherein the upper lead frame and the lower lead frame each further has a metal film electroplated thereon.

6. The semiconductor packaging structure as claimed in claim 1, wherein the cover is a transparent cover.

7. The semiconductor packaging structure as claimed in claim 1, wherein the cover is a metal cover.

8. The semiconductor packaging structure as claimed in claim 4, wherein the cover is a transparent cover.

9. The semiconductor packaging structure as claimed in claim 4, wherein the cover is a metal cover.

* * * * *